(12) United States Patent
Staeblein et al.

(10) Patent No.: US 6,364,946 B2
(45) Date of Patent: Apr. 2, 2002

(54) METHODS FOR GROWING LARGE-VOLUME SINGLE CRYSTALS FROM CALCIUM FLUORIDE AND THEIR USES

(75) Inventors: Joerg Staeblein, Jena; Andreas Weisleder, Tautenhain; Gunther Wehrhan; Burkhard Speit, both of Jena; Lutz Parthier, Berlin, all of (DE)

(73) Assignee: Schott Glas, Mainz (DE)

( * ) Notice: Subject to any disclaimer, the term of this patent is extended or adjusted under 35 U.S.C. 154(b) by 0 days.

(21) Appl. No.: 09/798,631

(22) Filed: Mar. 2, 2001

(30) Foreign Application Priority Data

Mar. 3, 2000 (DE) .......................................... 100 10 485

(51) Int. Cl.$^7$ .............................................. C30B 11/04
(52) U.S. Cl. .......................................... 117/81; 117/83
(58) Field of Search ...................................... 117/81, 83

(56) References Cited

FOREIGN PATENT DOCUMENTS

| DE | 213 514 | 9/1984 |
|----|---------|--------|
| EP | 0 939147 A | 9/1999 |
| EP | 0 972 863 A | 1/2000 |

OTHER PUBLICATIONS

Database WPI Section CH, Week 198503 Derwent Publications LTD., London, GB, Class E33, AN 1985–012921, XP 00216271 & DD 213 514 A, Sep. 12, 1984.

Wilke, K.: "Kristall Zuechtung" KristallZuechtung in Fester Phase, Verlag Harri Deutsch, Thun–Frankfyrt Am Main, 1988, P. 1088.

*Primary Examiner*—Felisa Hiteshew
(74) *Attorney, Agent, or Firm*—Michael J. Striker

(57) ABSTRACT

The method for making a uniform, large-size single crystal of calcium fluoride includes placing a single precursor crystal of calcium fluoride in a tempering vessel provided with a cover; introducing calcium fluoride powder into the tempering vessel and subsequently heating the single precursor crystal, preferably in intimate contact with the calcium fluoride powder, in the tempering vessel together with the calcium fluoride powder for two or more hours at temperatures above 1150° C. to temper the precursor crystal and thus form the uniform, large-scale single crystal of calcium fluoride. The uniform large-sized single crystals of calcium fluoride can be used to make improved lens, prism, light-conducting rod, optical window or other optical component for DUV photolithography, steppers, excimer lasers, wafers, computer chips and electronic devices containing the wafers and chips.

15 Claims, No Drawings

METHODS FOR GROWING LARGE-VOLUME SINGLE CRYSTALS FROM CALCIUM FLUORIDE AND THEIR USES

BACKGROUND OF THE INVENTION

1. Field of the Invention

The present invention relates to methods for growing highly homogeneous large-volume single crystals from calcium fluoride by tempering at elevated temperature, especially in an oven, and their uses.

2. Prior Art

Single crystals, especially calcium fluoride single crystals, are required as starting materials for optical components in DUV-photolithography, such as steppers or excimer lasers. They are conventionally used as lenses or prisms. They are especially used to optically copy fine structures into integrated circuits, computer chips and/or photo-lacquer-coated wafers. For these purposes it is necessary that these optical components have a high degree of uniformity, i.e. that their index of refraction n must be exactly constant throughout the entire crystal. This means that the index of refraction difference $\Delta n$ should vary by at most $5 \times 10^{-6}$, preferably not more than $2 \times 10^{-6}$. Since, on the one hand, the requirements for circuits of this type and computer chips are continuously increasing, their production rate also must continuously increase. Also ever large wafers are frequently required for applications. For example, wafer diameters of 200 mm have been required in the meantime. This however presupposes that the diameters of the optical components required for illumination of the wafer are similarly larger. In order to be able to make minute circuits and/or computer chips with high throughput, the differences in the index of refraction at different positions throughout the crystal volume should not be larger than $1 \times 10^{-6}$.

Growth of single crystals from the melt is known per se. Crystals, in principle, can be grown from the gas phase, the melt, from solution and even from a solid phase by recrystallization or solid body diffusion. Different processes for crystal growth are described in text books for crystal growth, such as the 1088 page work of K.-Th. Wilke and J. Bohm, entitled "Crystal Growth", Harri Deutsch Press, Thun, Frankfurt/Main, 1988 (ISBN 3-87144-971-7).

However single crystals for industrial applications are usually grown by solidification from a melt. The so-called Stockbarger-Bridgeman and the vertical gradient freeze processes are used for industrial manufacture of single crystals. The crystals are grown in a drawing oven and in a vacuum of $10^{-4}$ to $10^{-5}$ mbar in the Stockbarger-Bridgeman method. A crystalline raw material is melted, so that a homogeneous single crystal is obtained with exacting control of temperature.

In order to make the single crystals up to now the crystalline raw material is slowly heated in a vessel to the volatilization or evaporation temperature of water of about 400° C. and is maintained at this temperature in order to keep it free of water for some time. Additive scavengers, such as $PbF_2$, $SnF_2$ or $ZnF_2$, are used to remove oxygen from the raw material. The added scavengers react with the oxygen present in the raw material and arising partially by oxidation and/or hydrolysis to form easily volatile oxides, which escape at these temperatures. After that a so-called refinement during a single week at 1450° C. usually is performed followed by a multi-week cooling to about 1200° C., in which the desired crystal is solidified from the melt. The single crystal so obtained is then cooled in a first slow cooling phase and then cooled to room temperature in a second accelerated cooling phase after the first cooling phase.

Since the heat flow is not completely under control in a crystal growth unit of this type, so-called stress birefringence usually arises during crystallization. Furthermore various crystal orientations, so-called block formations, also form. Although the $CaF_2$ single crystals are held for a considerable time at a high temperature after crystallization, the stress birefringence usually still amounts to 5 to 20 nm/cm, which is too large for later use. The high stress birefringence is still further increased by sawing or cutting the single crystal and by mechanical working of the optical elements, for example by milling and polishing.

For this reason attempts have already been made to improve the uniformity of the single crystals produced by heating them to a temperature under their melting point for an extended duration. The desired homogeneity can thus be attained by keeping the single crystal at an elevated temperature for an extended time after its formation so that the mechanical stresses and optical faults are reduced or eliminated by rearrangement of the atoms of the crystal lattice. This process is usually referred to as tempering.

For example, a tempering process is described in DD-PS 213514, in which a calcium fluoride crystal is heated at a temperature of 1200° C. in a $PbF_2$-containing atmosphere, at a $PbF_2$ partial pressure of 0.01 to Torr (1.33 Pa to 133.3 Pa). The purpose of the $PbF_2$ is to getter the residual oxygen present in the calcium fluoride crystal. In this process the stress birefringence present of 10 to 25 nm/cm is reduced to only 1 nm/cm by a two to three hour heating at 1200° C. for a crystal of a diameter of 20 nm and a thickness of 10 mm. With this process however it was not possible to improve the stress birefringence of substantially larger calcium fluoride single crystals, i.e. single crystals of a diameter greater than 200 mm, especially greater than 300 nm, and a thickness of 50 to 400 mm, or also of already polished and worked optical elements during economical processing times. During experiments, which shorten the tempering time and/or improve the tempering, the tempering temperature is still further increased, which leads to a great loss in volume for the single crystals. Also finished optics rapidly loose their worked shape in these latter tempering processes.

A method for making calcium fluoride single crystals, especially for photolithography, is described in EP A 939 147. Large single crystals are introduced into a closed container and heated to a first temperature between 1020° C. and 1150° C. and after that are cooled in a first stage with a cooling rate of at most 1.2° C./h to 2° C./h at temperatures of from 600 to 900° C. After that they are cooled to room temperature with a cooling rate of at most 5° C./h. In preferred embodiments the tempering is performed in a fluorine gas-containing atmosphere and under protective gas.

It has been shown however that no satisfactory uniformity can be attained with sufficient yield with the known methods.

SUMMARY OF THE INVENTION

It is an object of the present invention to overcome the above-described problems and to provide a method of preparation for highly homogeneous single crystals, which have a constant index of refraction and small stress birefringence, and optical elements made from them in a satisfactory yield.

It is another object of the present invention to overcome the above-described problems and to provide a method of preparation for highly homogeneous single crystals, which have an index of refraction that does not vary more than $\Delta n = 5 \times 10^{-6}$.

It is an additional object of the present invention to avoid or eliminate the formation of small-angle grain boundaries or other low-dimensional crystal defects.

It is a further object of the present invention to avoid or reduce fogging or opacity formation during tempering crystals.

According to the invention a single precursor crystal of calcium fluoride is placed in a tempering vessel provided with a cover in the presence of, preferably in contact with, a calcium fluoride powder and subsequently heated for at least two hours at a temperature above 1150° C. to temper the precursor crystal and thus form a uniform, large-scale single crystal of calcium fluoride.

It has been surprisingly found that mechanical stress, small angle grain boundaries and stress birefringence can be reduced and/or eliminated, when a finished single crystal is heated to a temperature over 1150° C. in the presence of a finely divided calcium fluoride powder.

It has been shown that surprisingly under the conditions used in the method according to the invention small angle grain boundaries, cellular structure and so-called twins, i.e. tilting of the crystal axis of less than 20°, can occur without material loss in a single crystal. Plainly salt ions in the crystal lattice can easily rearrange at these temperatures.

Preferably a finely divided calcium fluoride powder with an average grain size of from 100 nm to 1 mm is used in the tempering. Usually the average grain size amounts to 1 to 200 $\mu$m, preferably 5 to 100 $\mu$m, and especially preferably 10 to 50 $\mu$m. The surface area of the finely divided calcium fluoride powder should be at least 10-fold, preferably at least 100-fold, of the surface area of the material to be tempered. In especially preferred embodiments the powder has at least 1000 times, in many embodiments, 5000 times or even 10,000 times, the surface area of the tempered material.

It is particularly preferable when the crystals to be tempered and the finished optics are directly embedded in the tempering powder, so that an intimate direct contact occurs between the material to be tempered and the tempering powder.

The calcium fluoride powder preferably includes at least one scavenger in addition to calcium fluoride for removal of oxygen present in the crystal lattice. Preferably the scavengers include $PbF_2$, $ZnF_2$, $SnF_2$, graphite and other low melting fluorides and/or fluorine compounds, which are converted by any oxygen present to volatile compounds. $XeF_2$ is an additional preferred scavenger, which is a solid at room temperature. However when $XeF_2$ is heated it releases xenon gas and fluorine gas and thus acts as a low-temperature scavenger. The preferred grain size of the scavenger is equivalent to that of the $CaF_2$ powder, but can differ from it.

In an especially preferred embodiment the powder added for the tempering includes finely divided carbon, especially graphite.

Tempering at temperatures above 1200° C., especially above 1210° C., is especially preferred. The upper limit for the tempering temperature should be 1415° C., preferably 1370° C. Usually the maximum or upper limit for the temperature is 1300° C. As uniform a temperature as possible should preferably exist throughout the crystal lattice and/or in the tempering with the scavengers in the crystal. The temperature throughout the crystal lattice should vary no more than 5° C., especially no more than 2° C., preferably no more than 1° C.

It has proven especially suitable to heat first during tempering at a temperature of 350° C. to 600° C., preferably from 350° C. to 500° C., in order to process the calcium fluoride crystal and to remove the water introduced during storage and handling. Heating at 350° C. to 400° C. is particularly preferred. Preferably the heating takes place under vacuum. Usually the water removal or drying time amounts to 12 to 45, preferably 24 hours.

It has proven to be appropriate when the tempering is performed under a protective gas. Usually protective gases include nitrogen, helium, argon and/or xenon.

In an especially preferred embodiment the tempering is also performed in a fluorine-containing atmosphere, especially under a fluorine-containing protective gas. Fluorine gas is conducted and/or released by volatilization into a tempering oven and/or into a tempering vessel containing the tempering materials. Additional reactive fluorine gases include tetrafluoromethane and other fluorocarbon or fluorohydrocarbon substances.

An HF atmosphere is an especially preferable fluorine-containing atmosphere. In an additional preferred embodiment according to the invention the fluorine-containing atmosphere is used together with an inert gas. Preferably the gas mixture used contains 0.1 to 20 percent fluorine gas, especially from 1 to 10 percent. A mixture of HF and $N_2$ is especially preferred.

In a most preferred embodiment the fluorine-containing atmosphere is introduced in the form of a fluorine-releasing solid body, especially $XeF_2$. $XeF_2$ is a solid body at room temperature, which decomposes into Xe and F at temperatures above 190° C. For example, it is used in an airtight Teflon® bag.

It has proven especially appropriate when the tempering is performed in a reducing atmosphere. A reducing atmosphere is provided, for example, by addition of graphite powder, which reacts with water to form $CO/CO_2$ and $CH_4$, which itself has a reducing effect. In contrast to calcium oxide the partially gaseous lead fluoride has a reducing oxygen-removing action. Calcium oxide arising by water or present in calcium crystals can be converted to calcium fluoride in this way, which reduces the hazy or foggy appearance of the crystal as well as the small angle grain boundaries.

It has also proven especially appropriate to maintain a calcium fluoride partial pressure of 0.1 to 10 mbar, preferably 0.7 to 1.5 mbar, especially preferably 0.8 to 1 mbar, in the interior of the tempering vessel containing the tempering materials. The tempering vessel is designed so that it is of course not gas tight, but only has a small flow-through rate and thus only a small loss of volatile impurities, such as water and lead oxide or $CO_2$, is possible. Because of that feature only small amounts of the atmosphere surrounding the tempering materials can be lost and a quasi-stationary state exists as long as there is sufficient tempering powder and/or protective and/or fluorine gas.

The tempering vessel and the entire tempering oven is made of graphite. In this way undesirable reactions are avoided. Furthermore graphite is particularly resistant to the exceptionally reactive hydrofluoric acid at the treatment temperatures.

Preferably the temperature in the method according to the invention is first from 200 to 450° C., preferably 300 to 400° C., and is maintained at these values for a considerable time, usually at least ten hours, especially at least 20 hours. It has proven especial suitable to employ a vacuum in these method steps at these temperatures in order to remove de-sorbed water. Subsequently heating to 800° C. occurs and then slowly to 900° C. at a rate of temperature increase of 1 to 30° C./h, preferably from 5 to 20° C./h, especially preferably from 8 to 12° C./h, at which the scavengers react. After that tempering takes place preferably at temperatures between 1200° C. and a maximum of 1300° C., usually up to 1220° C., for one to 24 hours, preferably from 2 to 10 hours, especially preferably from 3 to 5 hours. Subsequently cooling to 850° C. takes place and after the cooling re-heating to 950° C. takes place. This method clearly improves removal of defects without noticeable diffusion, e.g. haze or fog formation. Further cooling then occurs slowly to 680 to 740° C., preferably from 690 to 710° C., at a cooling rate of 0.5° C. to 5°C./h, preferably 1 to 3° C./h. Subsequently the cooling rate is gradually increased to a maximum of 5° C./h, appropriately about 3° C./h, and from about 400° C. is cooled to room temperature at a cooling rate of about 5 to 10° C./h.

The following example illustrates the claimed invention in more detail but should not be considered to limit the broad concept of the invention according to the appended claims.

EXAMPLE

A single precursor crystal made by means of the Stockbager-Bridgeman method having a diameter of 300 mm and a thickness of 600 mm is embedded in a finely divided calcium fluoride powder in a graphite vessel closed with a cover. The calcium fluoride powder contains 20 percent by weight $PbF_2$ powder and 10 percent by weight graphite as well as calcium fluoride powder. This is introduced into a Teflon® bag containing $XeF_2$. The precursor crystal to be tempered is in contact with the finely divided powder, which surrounds it on all sides. The surface area of the calcium fluoride powder is about 3000 times that of the single crystal. After that the tempering vessel containing the powder and the single precursor crystal is slowly heated to 370° C. under vacuum. Eventually the water present is removed over a time interval of 24 hours. Subsequently heating to 800° C. takes place. From this latter temperature to 900° C. heating at a rate of 10°C./h takes place and scavenging with the scavenging agent or agents occurs. After that the tempering vessel with the crystal is heated to 1220° C. and is maintained at that temperature for four hours. A pressure of 10 mbar, which is the sum of the partial pressures of calcium fluoride, lead fluoride, graphite/CO, Xenon and fluorine gas, is formed in the interior of the graphite vessel closed with the cover. Subsequently cooling to 850° C. takes place, but after that heating to 950° C. occurs. After that cooling to 700° C. is performed at a rate of 2° C./h. Then cooling to room temperature occurs at a rate of 3° C./h and finally at a rate of 5 to 10° C./h. The result of these method steps is a highly uniform or homogeneous single crystal, that is a single crystal in which the index of refraction at different positions in the crystal varies by less than $1 \times 10^{-6}$. Furthermore the resulting single crystal does not have any optical scattering centers visible to the naked eye.

The disclosure in German Patent Application DE 100 10 485.1 of Mar. 3, 2000 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in methods for growing highly homogeneous large-volume single crystals from calcium fluoride by tempering at elevated temperature, especially in an oven, and their uses, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A method for making a uniform, large-size single crystal of calcium fluoride, said method comprising the steps of:
   a) placing a single precursor crystal of said calcium fluoride in a tempering vessel provided with a cover;
   b) introducing calcium fluoride powder into the tempering vessel; and
   c) after the placing and introducing of steps a) and b), heating the single precursor crystal placed in the tempering vessel together with the calcium fluoride powder for at least two hours at temperatures above 1150° C. to temper the precursor crystal and thus form the uniform, large-scale single crystal of calcium fluoride.

2. The method as defined in claim 1, wherein the tempering vessel at least partially comprises carbon.

3. The method as defined in claim 1, further comprising the step of introducing at least one powder ingredient selected from the group consisting of $PbF_2$ powder and graphite powder into the tempering vessel prior to the heating.

4. The method as defined in claim 3, wherein said powder ingredient and said calcium fluoride powder each has a grain size of from 100 nm to 200 $\mu$m.

5. The method as defined in claim 1, further comprising the step of performing the heating of the precursor crystal under a reducing atmosphere.

6. The method as defined in claim 1, further comprising the step of performing the heating of the precursor crystal under a protective gas.

7. The method as defined in claim 6, wherein said protective gas is at least one member selected from the group consisting of $N_2$, Ar, He and Xe.

8. The method as defined in claim 1, further comprising the step of performing the heating under a fluorine-containing atmosphere.

9. The method as defined in claim 8, wherein said fluorine-containing atmosphere comprises at least one fluorine ingredient selected from the group consisting of $F_2$, HF, fluorocarbons and fluorohydrocarbons.

10. The method as defined in claim 1, wherein the single precursor crystal of the calcium fluoride is in direct contact with the calcium fluoride powder during the heating.

11. The method as defined in claim 1 or 10, further comprising the steps of halting the heating when the single precursor crystal has reached an elevated temperature between 1150° C. and 1170° C., maintaining the precursor crystal at said elevated temperature for hardening or curing, subsequently continuing the heating of the precursor crystal until another temperature over 1170° is reached and then maintaining the precursor crystal at said another temperature for said at least two hours.

12. A method of making a lens, prism, light-conducting rod, optical window or other optical component for DUV photolithography, steppers, excimer lasers, wafers, computer chips and electronic devices containing the wafers and chips, said method comprising the steps of:

a) placing a single precursor crystal of calcium fluoride in a tempering vessel provided with a cover;

b) introducing calcium fluoride powder into the tempering vessel; and c) after the placing and introducing of steps a) and b), heating the single precursor crystal placed in the tempering vessel for at least two hours over 1150° C. to temper the single precursor crystal and thus form a uniform, large-scale single crystal of the calcium fluoride.

13. The method as defined in claim 12, wherein the single precursor crystal of the calcium fluoride is in direct contact with the calcium fluoride powder during the heating.

14. The method as defined in claim 12 or 13, further comprising the steps of halting the heating when the single precursor crystal has reached an elevated temperature between 1150° C. and 1170° C., maintaining the single precursor crystal at said elevated temperature for hardening or curing, subsequently continuing the heating of the precursor crystal until another temperature over 1170° is reached and then maintaining the precursor crystal at said another temperature for said at least two hours.

15. The method as defined in claim 12, wherein the single precursor crystal is under a protective atmosphere, a reducing atmosphere or a fluorine-containing atmosphere during the heating.

* * * * *